(12) United States Patent
Tam

(10) Patent No.: US 9,276,140 B1
(45) Date of Patent: Mar. 1, 2016

(54) IMAGER MODULE WITH INTERPOSER CHIP

(71) Applicant: Amazon Technologies, Inc., Seattle, WA (US)

(72) Inventor: Samuel Waising Tam, Daly City, CA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 14/487,840

(22) Filed: Sep. 16, 2014

(51) Int. Cl.
*H04N 5/225* (2006.01)
*H01L 31/02* (2006.01)
*H01L 31/0232* (2014.01)
*H01L 31/18* (2006.01)

(52) U.S. Cl.
CPC .... *H01L 31/02002* (2013.01); *H01L 31/02016* (2013.01); *H01L 31/02325* (2013.01); *H01L 31/18* (2013.01)

(58) Field of Classification Search
CPC ............ H01L 31/02002; H01L 31/02016; H01L 31/02325; H01L 31/18; H01L 41/0825; H01L 41/083
See application file for complete search history.

(56) References Cited

U.S. PATENT DOCUMENTS

| | | | |
|---|---|---|---|
| 2005/0057672 A1* | 3/2005 | Summa et al. | 348/273 |
| 2010/0039553 A1* | 2/2010 | Kim et al. | 348/374 |
| 2013/0128108 A1* | 5/2013 | Oh et al. | 348/374 |
| 2013/0221067 A1* | 8/2013 | Lee et al. | 228/1.1 |

OTHER PUBLICATIONS

Humpston, Giles; "Camera modules, image sensor wafer-level packaging, and silicon layout:" Dec. 15, 2006. (15 pgs.).
Humpston, Giles; "Wafer level packaging of image sensors;" as accessed Sep. 16, 2014 (14 pgs.) at: http://electroiq.com/blog/2011/01/wafer-level-packaging-of-image-sensors/.
Tsai, Colin; "Wafer Level Packaging Solution for CMOS Image Sensors." (3 pgs.).

* cited by examiner

*Primary Examiner* — Howard Weiss
*Assistant Examiner* — Sue Tang
(74) *Attorney, Agent, or Firm* — Sutherland Asbill & Brennan LLP

(57) ABSTRACT

An imager module having an interposer chip electrically connected to and routing signals between an image sensor, a printed circuit board (PCB), and a voice coil motor (VCM) is disclosed. In some example embodiments, one or more surface mount devices (SMDs) may further be attached to the interposer chip, the PCB, or both the interposer chip and the PCB. The interposer chip may further have a cavity therethrough to allow light to impinge in the image sensor. The interposer chip may still further have through silicon vias (TSVs) to route signals from the PCB to the VCM.

16 Claims, 7 Drawing Sheets

IMAGER MODULE WITH INTERPOSER CHIP

BACKGROUND

Imaging systems with semiconductor image sensors (e.g., charge coupled device (CCD) image sensors, complementary metal oxide semiconductor (CMOS) image sensors, etc.) may be incorporated in user devices such as smartphones and tablet computing devices. Often times, the form factors of these user devices are aggressively designed. Therefore, the volume of space available for imaging systems within these user devices may be limited. Furthermore, these types of user devices may be subject to vibration and/or mechanical shock (e.g., a user drops his/her smartphone that has an imaging system).

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items; however, various embodiments may utilize elements and/or components other than those illustrated in the figures.

DETAILED DESCRIPTION

Overview

Example embodiments of the present disclosure are directed to, among other things, an imager module for capturing digital images. In example embodiments, the imager module may have a relatively compact form factor and may be relatively robust to thermal cycling, vibrations, or other modes of failure. The imager module, in example embodiments, may include an interposer chip, such as a silicon interposer chip, disposed between an image sensor and a printed circuit board (PCB). The interposer chip may be configured to route and/or fan out signals to/from the image sensor to the PCB via bond pads and through silicon vias (TSVs). The image sensor may be attached to the interposer chip, such as by flip chip, and the interposer chip may be attached to the PCB, such as by anisotropic conductive paste (ACP). The interposer chip may further be attached to a lens assembly that may further be attached to a voice coil motor (VCM) for moving the lens assembly.

Figure 1:
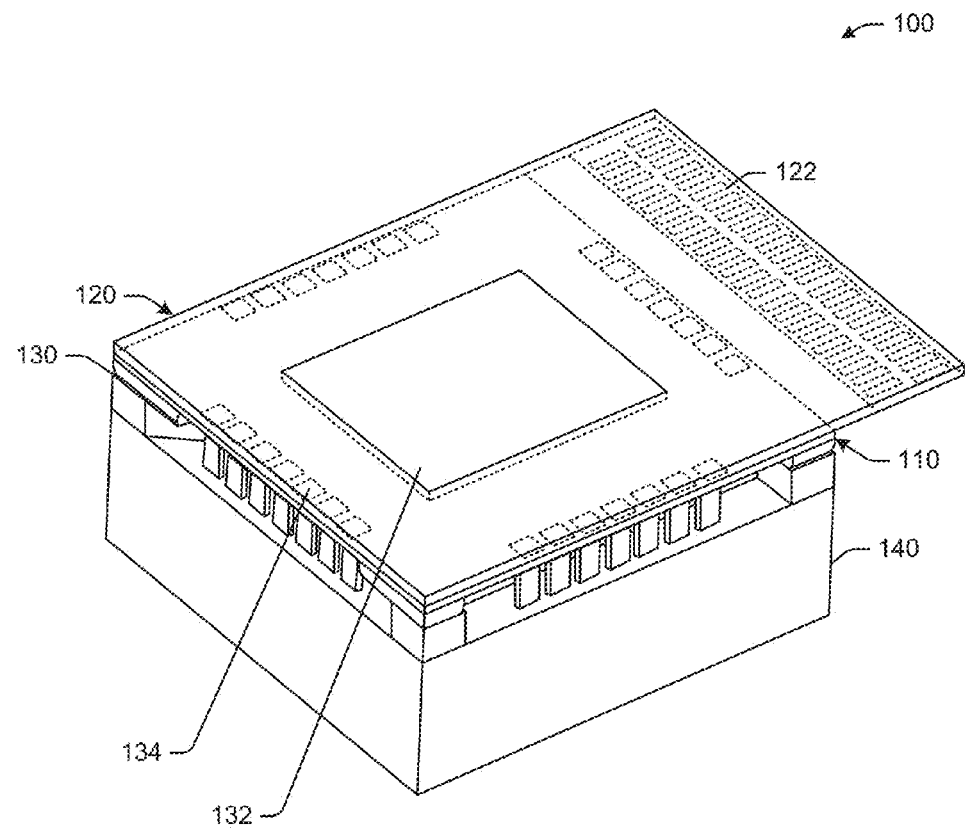
FIG. 1 is a schematic diagram illustrating an example imager module with an interposer chip, in accordance with example embodiments of the disclosure.

FIG. 1 is a schematic diagram illustrating an example imager module 100 with an interposer chip 110, in accordance with example embodiments of the disclosure. The interposer chip 110, as depicted, may be electrically and mechanically connected, on a first side, to a PCB 120 that may have one or more electrical contacts 122 thereon to evacuate electrical signals, such as image sensor signals, from the imager module 100. An image sensor 132 may also be electrically and mechanically connected to the interposer chip 110 on that first side. The interposer chip 110 may further be attached, on a second side, to a lens assembly 130. The imager module 100 may further have a voice coil motor (VCM) 140 or other electromechanical device electrically coupled to the interposer chip 110 to move the lens assembly 130 for the purpose of focusing an image on the photosensitive elements of the image sensor 132.

The interposer chip 110 may, in example embodiments, be fabricated from an interposer die, as will be described in greater detail with reference to FIGS. 2 and 3. The interposer die may be fabricated, in example embodiments, from silicon (Si), such as silicon wafers of any suitable size (e.g., 4 inch diameter, 6 inch diameter, etc.), and orientation. In other example embodiments, the interposer die may be fabricated from non-silicon rigid materials, such as glass, quartz, III-V semiconductor substrates (e.g., GaAs, InP, etc.), or sapphire.

In some example embodiments, the interposer die may have interconnects (e.g., metallic traces) thereon for routing electrical signals, such as electrical signals from the PCB 120, the image sensor 132, the VCM 140, and/or discrete electronic devices that may be disposed on the interposer chip 110 and/or the PCB 120. The interposer die may have one or more levels of metallic interconnects on one or both sides of the interposer die. The interconnect metal traces and/or vias on one or both of the sides of the interposer die may be fabricated using any suitable processes and any suitable materials. The interconnect metal traces may be fabricated by either subtractive metallization processes (e.g., Al physical vapor deposition (PVD)/plasma etch) or by inlaid processes (e.g., Cu damascene integration). In some cases, both subtractive and inlaid processes may be used, such as on different layers of interconnects. In some example embodiments, bond pads may be formed on one or both sides of the interposer die, such as in the top layer of the metallic interconnect on either side of the interposer die. These bond pads may enable the electrical and mechanical attachment of a variety of elements onto the interposer chip 110, such as the image sensor 132, the PCB 120, and/or the VCM 140. The bond pads may be used for forming joints, or otherwise electrically and mechanically joining bonding elements of the electrical components. Any suitable mechanism may be used for joining components onto the interposer die, such as flip-chip, thermo-sonic bonding, thermo-compression bonding, solder bonding, wire bond, ACP, non-conductive paste (NCP), wedge bonding, combinations thereof, or the like.

The interposer die, in example embodiments, may further include one or more TSVs for making electrical contacts through the interposer die from one side to the other side. The TSV may be fabricated in the interposer die by any variety of suitable processes. These processes may include processes for making the TSV holes, electrically and/or chemically insulating the TSV holes, and/or filling and/or making contact to the TSV holes. In some example embodiments, the TSVs may underlie other interconnect metal layers of the interposer chip 110, such as bond pads. In other example embodiments, the ends of the TSVs may form electrical surfaces onto which other electrical components may be attached, such as by flip-chip, wirebond, or ACP.

In some example embodiments, the interposer chip 110 may have discrete electronic devices, such as surface mount devices (SMDs), disposed thereon. In other words, one or more SMDs may be electrically and mechanically attached to one or both surfaces of the interposer chip 110, in example embodiments, such as by surface mount technology (SMT). These components may be attached to the interposer chip 110 using any suitable surface mount mechanism, such as pick-and-place with thermo-compression solder joints or thermo-sonic gold-to-gold (Au/Au) bonding. In the embodiments where SMT is performed on the interposer die, the interposer chip 110 may have molding thereon for protecting the SMDs. The molding may be made of thermosetting polymer materials, in example embodiments. In other example embodiments, the interposer chip 110 may not have any SMDs thereon, and instead, one or more SMDs may be provided on the PCB 120, such as on one or both sides of the PCB 120. In these example embodiments, the processes performed on the interposer chip 110 may be fewer than the processes used if the SMDs are directly provided on the interposer chip 110.

The interposer die may have a hole or cavity therein, such as at the center of the interposer die. This cavity may allow for light to pass from the lens assembly 130 to the image sensor 132, through the cavity. The image sensor 132 may be attached to the interposer die in a manner where electrical contacts (e.g., bond pads) on the image sensor 132 may align with corresponding contacts of the interposer die and such that photosensitive pixel elements of the image sensor 132 may be configured to receive light reflected and/or emitted by objects to be imaged through the cavity in the interposer die. The cavity in the interposer die may be fabricated by chemical etching processes (e.g., potassium hydroxide (KOH) etching, tetramethylammonium hydroxide (TMAH) etching, etc.) or plasma assisted etching processes (e.g., reactive ion etching (RIE), high-density plasma (HDP) etching, Bosch etching, etc.).

The image sensor 132 may be of any suitable type, such as active-pixel, charge coupled device (CCD), complementary metal-oxide-semiconductor (CMOS), or the like. The image sensor 132 may be electrically and mechanically attached to the interposer die by any suitable mechanism, such as flip-chip, ACP, NCP, Au/Au bonds, or the like. The image sensor 132 may be of any suitable pixel count and/or aspect ratio. For example, the image sensor 132 may have an aspect ratio of 4:3 and have 13 million pixels (megapixels). When an image is captured by the image sensor 132, an image signal corresponding to the captured image may be generated. This image signal may represent the intensity and/or color of each of the pixels of the captured image. Each of the pixels of the captured image correspond to the photosensitive pixels of the image sensor 132.

The PCB 120 or flexible printed circuit (FPC) may be made of any suitable material, such as FR-4, laminate, polyimide, or other electrical substrate materials. The PCB 120, in example embodiments, may be configured to provide electrical signals to and from the imager module 100, such as via electrical contacts 122 and bond pads 134. For example, the PCB may be configured to receive and/or send electrical signals from and/or to the PCB 120 of the imager module 100. The PCB 120 may be connected to one or more other PCBs, such as a main board or mother board of the imager module 100, such as a smartphone, a tablet computing device, a laptop computer, a wearable device, or the like. The PCB 120 may be electrically connected to other electrical boards and/or devices via the electrical contacts 122 by any suitable mechanism, such as solder connections, ribbon connectors, and/or connector modules. The PCB 120 may be configured to receive and route image sensor control signals, such as from the PCB 120 external to the imager module 100, to the image sensor 132 via the interposer chip 110. The PCB 120 may further be configured to receive and route autofocus (AF) control signals, such as from an autofocus controller or other processor, to the VCM 140 via the interposer chip 110 to enable autofocus of the imager module 100 by moving the lens assembly 130. The PCB 120 may still further be configured to route image signals generated by the image sensor 132, by capturing an image, to entities external to the imager module 100, such as an external processor.

The lens assembly 130 may include one or more optical elements, such as one or more lenses and/or mirrors. In some example embodiments, the lens assembly 130 may include a single lens. The lens assembly 130 and/or the lenses therein may be moved (e.g., displaced from a quiescent point) by the VCM 140. The lens assembly 130 may be mechanically attached to the interposer chip 110, by any suitable mechanism, including, for example, epoxy material. The lens assembly 130 may be aligned, such as by a pick-and-place process performed by a pick-and-place system, over the hole in the interposer chip 110 through which light travels to impinge on the photosensitive array of pixels of the image sensor 132. The lens assembly 130, in example embodiments, may be configured to collect and direct light from an object to be imaged by the imager module 100 to the image sensor 132. In example embodiments, the lens assembly 130 may be attached to the interposer chip 110 on the opposite side of the interposer chip 110 than the side on which the image sensor 132 is attached. In this way, light from the object to be imaged may be focused by the lens assembly 130 and travel through the space of the cavity in the interposer chip 110 to impinge on the photosensitive pixels of the image sensor 132.

The VCM 140 may be mechanically coupled to the lens assembly 130 and electrically coupled to the interposer chip 110 and may be configured to receive one or more AF control signals and move the lens assembly 130 based at least in part on the received AF control signals. The VCM 140 may be electrically coupled by electrical contacts to the interposer chip 110, in example embodiments, on a side opposite the side on which the PCB 120 and the image sensor 132 are electrically coupled. It will be appreciated that while the lens assembly 130 autofocus is described with relation to the VCM 140, any suitable electromechanical device that may be used to displace the lens assembly 130 may be used. Other electromechanical devices may include piezomotors, MEMS based deflectors, or the like.

It will be appreciated that the interposer chip 110, in example embodiments, to enable the aforementioned configurations, may have a first set of bond pads or electrical contacts on a first side (e.g., top side) that may be used to make electrical contact with the image sensor 132. The interposer chip 110, in example embodiments, may further have a second set of bond pads on the first side (e.g., top side) to make contact with the PCB 120. The interposer chip 110, in example embodiments, may still further have a third set of bond pads on a second side (e.g., bottom side) to make contact with the VCM 140 or other electromechanical device. In some example embodiments, where the interposer chip 110 may have the SMD(s) disposed thereon, the interposer chip 110 may still further have a fourth set of bond pads on the second side (e.g., the bottom side) onto which the SMD(s)

may be attached. In some example embodiments, where the SMD(s) are disposed on the interposer chip 110, a molding may be provided on top of the SMD(s) that are attached to the interposer chip 110. TSVs may be provided within the interposer chip 110, in example embodiments, to route signals from a first side of the interposer chip 110 to a second side of the interposer chip 110. For example, AF control signals to control the VCM 140 may be received from an entity external to the imager module 100 via the PCB 120. These AF control signals may, therefore, in example embodiments, be routed from the PCB 120 via the bond pads by which the PCB 120 electrically contacts the interposer chip 110, one or more levels of interconnects on the interposer chip 110, one or more TSVs, and one or more bond pads by which the VCM 140 electrically contacts the interposer chip 110.

It will be appreciated that the imager module 100 with the interposer chip 110 may allow for a smaller size and/or finer pitch connection between the image sensor 132 and the interposer chip 110. This may be enabled because the interposer chip 110 allows for a relatively more rigid bonding substrate than flexible circuit board materials, such as FR-4. The interposer chip 110 may result in reduced warpage relative to flexible circuit board materials, thereby enabling smaller size flip-chip connections between the image sensor 132 and the interposer chip 110. Furthermore, the image senor 132 fabricated on silicon, may be the same substrate material as the interposer chip 110. As a result, the coefficient of thermal expansion (CTE) is substantially matched between the image sensor 132 and the interposer chip 110. This may lead to relatively high levels of reliability of the interposer chip 110 to the image sensor 132 joint under use and/or test conditions, such as thermal cycling, autoclave, or the like. Due to CTE match, low warpage, and highly reliable joints and/or connections between the image sensor 132 and the interposer chip 110, small size joints may be made between the image sensor 132 and the interposer chip 110. For example, the bond pads on the interposer chip 110 that interface with the image sensor 132 may be about 75 to about 100 micrometers (μm) or less in width or diameter. In some cases, the bond pads on the interposer chip 110 to interface with the image sensor 132 may be about 20 μm, or less, in width or diameter. The bond pads on the image senor 132 side may also be a smaller and/or finer pitch than if the image sensor 132 was to be attached to a PCB. Therefore, fewer metal interconnect levels of fan out may be needed on the image sensor 132 to interface with the interposer chip 110, resulting in processing cost savings. For example, an image sensor that is to be flip-chipped onto a PCB may have bond pads that are about 200 μm or greater in width and may have four layers of metal interconnects to fan out to that size and pitch of the bond pads. On the other hand, in this example, if a similar image sensor is attached to a silicon interposer with 20 μm bond pads, only two layers of metal interconnects may be needed to fan out the image sensor signals to 20 μm bond pads.

The PCB 120 may be attached to the interposer chip 110 via the bond pads 134. These bond pads 134 may be greater in area than the bond pads used to attach the image sensor 132 to the interposer chip 110. For example, the interposer chip 110 may have 70-100 μm width bond pads. In other words, the interposer chip 110 may have a first set of bond pads on the first side for attaching the image sensor 132 and a second set of bond pads for attaching the PCB 120, and each of the first set of bond pads may have a smaller area than each of the second set of bond pads.

It will further be appreciated that the imager module 100 using the interposer chip 110 may have a smaller form factor, such as a thinner profile, than an imager module that integrates all of the components (e.g., image sensor, VCM, lens assembly, SMDs) onto a PCB. The relatively compact form factor may enable the integration of the imager module 100 into personal user devices (e.g., mobile phones, wearable devices, etc.) where space may be limited.

This brief introduction, including section titles and corresponding summaries, is provided for the reader's convenience and is not intended to limit the scope of the claims nor the preceding sections. Furthermore, the techniques described above and below may be implemented in a number of ways and in a number of contexts. Several example implementations and contexts are provided with reference to the following figures, as described below in more detail. However, the following implementations and contexts are but a few of many.

Illustrative Structure

Figure 2:
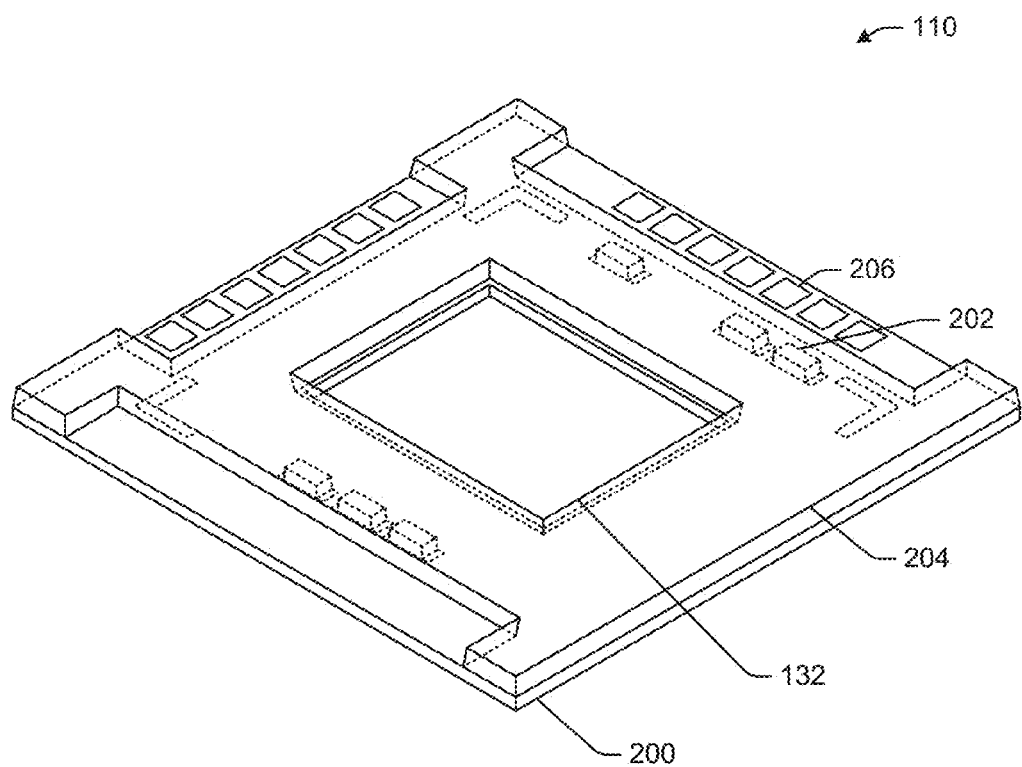
FIG. 2 is a schematic diagram illustrating an example interposer chip of the imager module depicted in FIG. 1 with an image sensor attached thereon, in accordance with example embodiments of the disclosure.

FIG. 2 is a schematic diagram illustrating an example interposer chip 110 of the imager module 100 depicted in FIG. 1 with an image sensor 132 attached thereon, in accordance with example embodiments of the disclosure. The interposer chip 110 may include an interposer die 200, such as an interposer die 200 fabricated on a silicon wafer. Alternatively, the interposer die 200 may be fabricated on any suitable substrate, such as GaAs wafers, InP wafers, glass substrates, polysilicon substrates, quartz substrates, sapphire substrates, or the like. The interposer chip may be fabricated using a variety of semiconductor processes, such as processes for forming TSVs, interconnect layers (e.g., metal routing layers), and/or bond pads. Any suitable process, such as reactive ion etching (RIE), laser ablation, chemical etching, plasma etching, chemical vapor deposition (CVD), physical vapor deposition (VPD), electron beam (ebeam) deposition, electroplating, electroless plating, annealing, ultraviolet (UV)/thermal curing, chemical-mechanical polish (CMP), photoresist spin, photolithography, ashing, combinations thereof, or the like, may be employed in fabricating the interposer die 200.

In example embodiments, the interposer die 200 may have two interconnect layers on each side. Bond pads for making contact to the image senor 132 and the PCB 120 may be on the same side (e.g., the top side) and formed in the upper layer of the metal interconnect of that side. Bond pads for making contact to the VCM 140 may be on the other side (e.g., the bottom side) of the interposer die 200 and formed in the upper layer of metal on that side. In other example embodiments, the interposer die 200 may have only one layer of metal interconnect on each side. In yet other example embodiments, the interposer die 200 may have more than two layers of metal on each side. In still other example embodiments, the interposer die 200 may have a different number of metal interconnect layers on each side. For example, the interposer die 200 may have three layers of metal interconnects on one side and one layer of metal interconnect on the other side.

As shown in this example embodiment, the interposer chip 110 may have one or more SMDs 202 disposed thereon. The SMDs 202 may be any variety of discrete devices, integrated circuits, passive devices, and/or active devices. The SMDs 202 may include, but are not limited to, resistors, inductors, capacitors, diodes, transistors, logic gates, microcontrollers, microprocessors, application specific integrated circuits, digital signal processors, amplifiers, analog circuits, digital circuits, combinations thereof, or the like. The SMDs 202 may be attached to the interposer die 200 using any suitable mechanism, including, for example, solder processes on in-line (e.g., dual in-line, quad in-line, etc.) packages, ball grid arrays (BGAs), or the like.

In example embodiments, where the SMDs 202 are disposed on the interposer chip 110, a molding 204 may be disposed on top of the SMDs 202. The molding 204 may provide a substantially planer surface on top of the SMDs 202 attached on the second side of the interposer chip 110. The molding 204 may be made of thermosetting polymer materials, in example embodiments. In example embodiments, a transfer molding process may be performed, where thermosetting polymer materials may be deposited on the surface (e.g., the surface of the interposer die 200 and the SMDs 202). In example embodiments, the molding 204 may be templated so as to leave open bond pads 206 on the surface of the interposer die 200 to make electrical contact with the VCM 140.

In example embodiments, the SMT process to attach the SMDs 202 on the interposer die 200 may be performed by pick-and-place techniques at a wafer level. In other words, the interposer die 200 may still be in wafer form (e.g., prior to singulating/sawing the interposer die 200). Alignment marks may be patterned on the surface of the interposer die to enable gross and/or fine alignment by the pick-and-place machines to attach the SMDs 202 to the interposer die 200. Furthermore, the molding process (e.g., template, thermosetting material deposition, cure, etc.) to fabricate the molding 204 may be performed at the wafer level prior to die singulation.

Once the SMDs 202 are attached to the interposer die 200 and the molding 204 is formed thereon, the image sensor 132 may be attached on the other side of the interposer die 200. The image sensor 132 may be attached to the interposer die 200 by a flip-chip process. In other words, the connecting bond pads of the image sensor 132 may make contact with the corresponding contacts of the interposer die 200 in a face-to-face orientation. In example embodiments, the image sensor 132 may be attached onto the interposer die 200 at a wafer level, prior to singulation of the interposer die 200.

Figure 3:
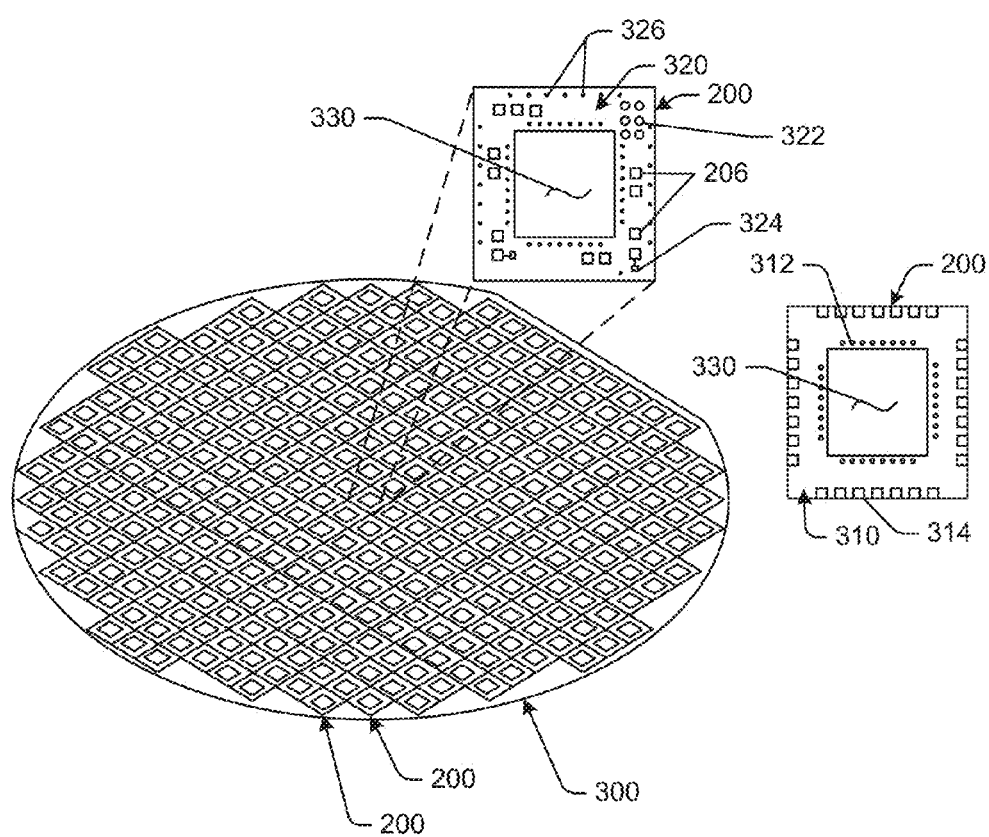
FIG. 3 is a schematic diagram of an interposer die with bond pads and through silicon vias (TSVs) used for fabricating the interposer chip depicted in FIG. 2, in accordance with example embodiments of the disclosure.

FIG. 3 is a schematic diagram of an interposer die 200 with bond pads 206 and through silicon vias (TSVs) used for fabricating the interposer chip depicted in FIG. 2, in accordance with example embodiments of the disclosure. As depicted here, the interposer die 200 may be fabricated on a wafer 300. The wafer 300 may have a plurality of interposer dies 200 fabricated thereon. The number of interposer dies 200 that are fabricated on a wafer may depend on the area of the interposer die 200 and the size of the wafer 300. The wafer 300 may be of any suitable size or orientation. For example, the wafer 300 may have a diameter of 100 millimeters (mm), 150 mm, 200 mm, or 200 mm, with or without flats and/or notches. Furthermore, the wafer 300 may be oriented crystalline silicon, oriented silicon, or polysilicon. Alternatively, the wafer 300 may be non-silicon material, such as glass, sapphire, quartz, or other suitable substrate materials. The wafer 300, and therefore the interposer die 200, may be of any suitable thickness, such as a thickness in the range of about 30 µm (0.03 mm) to about 200 µm (0.3 mm). In one example embodiment, the wafer 300, and therefore the interposer die 200, may have a thickness of about 200 µm. In another example embodiment, the wafer 300, and therefore the interposer die 200, may have a thickness of about 50 µm.

In some example embodiments, some of the processes to fabricate the wafer 300 may be performed at a thickness that is greater than the final thickness of the wafer 300 and the interposer die 200 fabricated thereon. For example, a 200 mm wafer may have a starting thickness of approximately 750 µm (0.75 mm). This wafer 300 may be processed on one side to form interconnect layers thereon. The wafer 300 may then be thinned, such as by backside grinding and/or polishing, to approximately the final thickness of the interposer die 200 to process the other side of the wafer 300. In example embodiments, some, but not all, of the processes associated with forming TSVs may be performed after thinning the wafer 300. In other example embodiments, all of the processes for forming the TSVs may be performed after thinning the wafer 300.

The interposer die 200 may have a first side 310 (e.g., top side) and a second side 320 (e.g., bottom side). The first side 310 may have a first set of bond pads 312 that may be utilized for attaching the image sensor 132 onto the interposer die 200. Although these first set of bond pads 312 is depicted as circular in shape, it does not need to be that shape, and may indeed be any suitable shape, including square or rectangular. The first set of bond pads 312 may be formed in a last layer (e.g., the top layer on the first side 310) of the metal interconnect fabricated on the interposer die 200. The first side 310 may further include a second set of bond pads 314 that may be utilized for attaching the PCB 120 to the interposer die 200. Although this second set of bond pads 314 is depicted as square in shape, it does not need to be that shape, and may indeed be any suitable shape, including circular or rectangular. The second set of bond pads 314 may be formed in a last layer (e.g., the top layer on the first side 310) of the metal interconnect fabricated on the interposer die 200. In example embodiments, the first set of bond pads 312 and the second set of bond pads 314 may be formed contemporaneously (e.g., by the same fabrication processes).

The number of the first set of bond pads 312 may depend, at least in part, on the number of electrical and/or mechanical contact points to be formed between the image sensor 132 and the interposer die 200. In some example embodiments, there may be dummy bond pads included in the first set of bond pads 312 for any variety of reasons, such as improved areal uniformity and/or improved process uniformity. The number of the second set of bond pads 314 may depend, at least in part, on the number of electrical and/or mechanical contact points to be formed between the PCB 120 and the interposer die 200. In some example embodiments, there may be dummy bond pads included in the second set of bond pads 314 for any variety of reasons, such as improved areal uniformity and/or improved process uniformity. In example embodiments, the size of the first set of bond pads 312 may be smaller than the size of the second set of bond pads 314. In other words, the width and/or the diameter of the first set of bond pads 312 for attaching the image sensor 132 (e.g., a silicon substrate element) to the interposer die 200 may be smaller than the second set of bond pads 314 for attaching the PCB 120 (e.g., a non-silicon substrate) to the interposer die 200.

In example embodiments, the first set of bond pads 312 may be used to route image sensor signals, such as when an image is captured by the image sensor 132. The image sensor signals may be routed, in example embodiments, from the image sensor 132 to the interposer chip 110 via the first set of bond pads 312 and then to the PCB 120 via the second set of bond pads 314, and then to one or more entities external to the imager module 100 via electrical contacts 122.

The second side 320 of the interposer die 200 may include a third set of bond pads 206 for making contact to the VCM 140, or other electromechanical device. The VCM 140 may be aligned and bonded to some or all of the third set of bond pads 206 for making electrical and mechanical contact to the interposer die 200. Although this third set of bond pads 206 is depicted as square in shape, it does not need to be that shape, and may indeed be any suitable shape, including circular or rectangular. The third set of bond pads 206 may be formed in a last layer (e.g., the top layer on the second side 320) of the metal interconnect fabricated on the interposer die 200.

The second side 320, in some example embodiments, may further include a fourth set of bond pads 322 that may be utilized for attaching one or more SMDs 202 to the interposer die 200. In other example embodiments, the interposer die 200 may not have the fourth set of bond pads 322 and, instead, the one or more SMDs 202 may be disposed on the PCB 120 that is attached to the first side 310 via the second set of bond pads 314. Although the fourth set of bond pads 322 is depicted as circular in shape, it does not need to be that shape, and may indeed be any suitable shape, including square or rectangular. The fourth set of bond pads 322 may be formed in a last layer (e.g., the top layer on the second side 320) of the metal interconnect fabricated on the interposer die 200. In example embodiments, the fourth set of bond pads 322 and the third set of bond pads 206 may be formed contemporaneously (e.g., by the same fabrication processes).

The interposer die 200 may still further include one or more embedded passive devices 324, such as a resistor, a capacitor, or an inductor. The embedded passive device 324 may be formed in/on the silicon of the interposer die 200. The embedded passive device 324 may be, for example, a resistor formed by a serpentine (e.g., long and narrow) metal line formed in the metal interconnect layer on either the first side 310 or the second side 320. As another example, the embedded passive device 324 may be an inductor formed as a nested serpentine metal line formed in the metal interconnect layer on either the first side 310 or the second side 320. As still another example, the embedded passive device 324 may be a capacitor formed as two metal plates on two different metal interconnect layers on either the first side 310 or the second side 320. In other example embodiments, the embedded passive device(s) 324 may be formed in the silicon substrate level, rather than, or in addition to, the metal interconnect levels. In these embodiments, doped elements on the silicon substrate of the interposer die 200 may be made and contacted using, for example, refractory metal plugs.

The interposer die 200 may further have one or more TSVs 326 therein, extending substantially from the first side 310 to the second side 320 for conducting electrical signals (e.g., current, voltage, etc.) between the interconnects formed on the first side 310 and the interconnects formed on the second side 320. The TSVs 326, while schematically represented in this schematic surface view, may not, in actuality, be visible by viewing the first side 310 or the second side 320 of the interposer die 200. Instead, the TSVs 326 may, in example embodiments, be seen in cross-sectional view, as will be discussed in conjunction with FIG. 4.

In example embodiments, the TSVs 326 may be configured to route one or more signals between the first side 310 and the second side 320 of the interposer die 200. For example, VCM control signals to control the VCM 140 to move the lens assembly 130 for the purposes of autofocusing the imager module 100 may be received from an entity external to the imager module 100 and routed via the PCB 120, the second set of bond pads 314, one or more interconnect metal levels, one or more TSVs 326, and the third set of bond pads 206 to the VCM 140.

The TSVs 326, in example embodiments, may be formed as a TSV-first integration (e.g., TSVs 326 are formed before other interconnect layers on the interposer die 200), a TSV-last integration (e.g., the TSVs 326 are formed after all but the last interconnect metal layer that is formed on the interposer die 200), or a TSV-in-the-middle integration (e.g., the TSVs 326 are formed after one or more interconnect layers are formed, but not before all but the last interconnect layer is formed). For the purposes of this discussion, all of the conducting interconnect layers (e.g., including the layers in which the bond pads on both sides 310, 320 are formed) are considered interconnect metal layers. Interconnect metal layers may be connected to the immediately adjacent layer (e.g., immediately above or below) on the same side 310, 320 by one or more inter-layer vias. Layers of interconnect metal layers in opposite sides 310, 320 of the interposer die 200 may be connected to each other via one or more TSVs 326. As discussed above, the TSVs 326 may extend the thickness of the interposer die 200 and the wafer 300 on which the interposer die 200 was created. The TSVs 326 may be any suitable length corresponding to the thickness of the interposer die 200. In example embodiments, the TSVs 326 may be 200 µm long. In other example embodiments, the TSVs 326 may be 50 µm long.

Interconnect metal layers may be formed on the first side 310 and the second side 320 of the interposer die 200 using any suitable mechanism. In some cases, both sides 310, 320 may have the same number of metal interconnect layers (e.g., three metal interconnect layers on each side 310, 320). In other example embodiments, there may be a different number of metal interconnect layers on the first side 310 compared to the second side 320. The metal interconnect layers may be formed by subtractive processes or by inlaid processes. For example in a subtractive process, a dielectric material (e.g., silicon dioxide ($SiO_2$)) may be grown or deposited, followed by deposition of a stack of refractory metal or alloys thereof (e.g., Ti, TiN, Ta, TaN, W, etc.) and Al. Then the aluminum may be patterned by spinning photoresist and photolithography. Next the metal stack may be etched by plasma etching. As such, a patterned metal interconnect layer may be formed by a subtractive integration. In an example inlaid or damascene process, dielectric material, such as $SiO_2$ or SiCOH, may be deposited, such as by plasma enhanced chemical vapor deposition (PECVD); patterned, such as using photo lithography; and etched, such as by RIE using fluorinated chemistries. Next, a seed metal layer may be deposited, such as by sputtering, and then a metal deposition may be performed, such as by electroplating Cu. After electroplating Cu, a chemical-mechanical polish (CMP) may be performed to polish Cu back to the trenches formed by the dielectric etch. As such, a patterned metal interconnect layer may be formed by a damascene or dual-damascene process.

The interposer die 200 may further have a cavity 330 defined therein. This cavity 330, when the imager module 100 is fully assembled, may allow light to pass therethrough, such as from the lens assembly 130. In example embodiments, the first set of bond pads 312 may be disposed on the interposer die 200 in proximity of the periphery defining the cavity 330. As such, the image sensor 132, when attached (e.g., flip chipped) onto the interposer die 200, may overly the cavity 330 with electrical contacts via the first set of bond pads 312 around the cavity 330 and with the photosensitive pixels of the image sensor 132 exposed, such as by light, through the cavity 330. In other words, if light enters the cavity 330 from the second side 320, and transverses the thickness of the interposer die 200, then that light may impinge on at least some of the photosensitive pixels of the image sensor 132. The configuration of the image sensor 132 to the interposer die 200 over the cavity 330 may provide for a relatively thin profile (e.g., compact form factor) that may be suitable for integration in personal mobile devices such as smartphones and tablet computers.

The cavity 330 may be formed by any suitable mechanism and at any point in the fabrication of the interposer die 200, such as prior to forming interconnect layers on the interconnect die, or alternatively, after forming the interconnect layers on the interposer die 200. The cavity 330 in the interposer die 200 may be fabricated by any suitable mechanism, such as by chemical etching using chemistries such as KOH or TMAH. In example embodiments, the cavity 330 may be defined by a sidewall along the thickness of the interposer die 200. In some example cases, this sidewall may have a slope that is not substantially 90°. For example, in some cases, a TMAH or KOH etch of silicon may result in sidewalls that are approximately 45°. In other example embodiments, the cavity 330 may be formed by plasma etching, such as deep silicon etching, RIE, Bosch etch, or the like.

Figure 4:
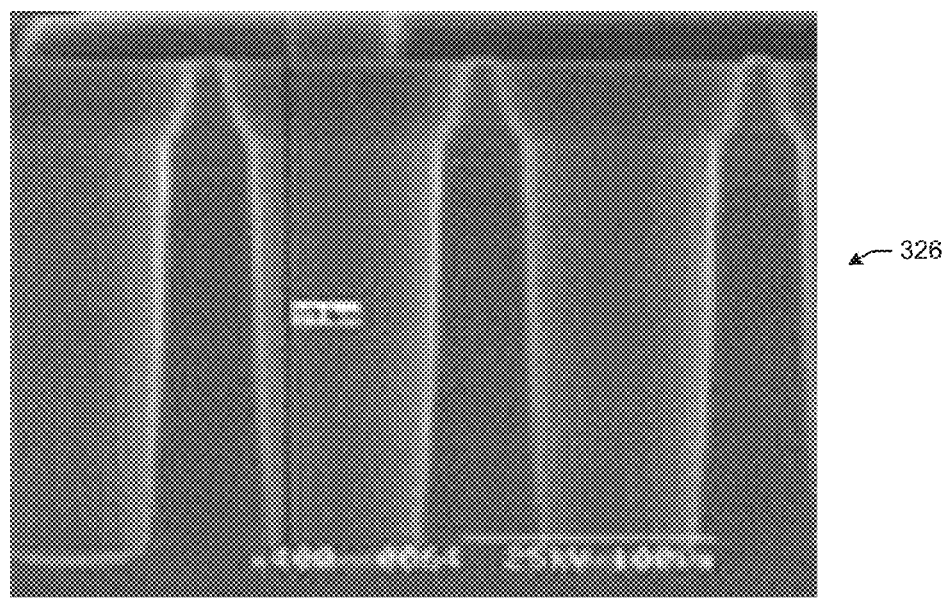
FIG. 4 is a photomicrograph of a cross section of an example TSV hole in the interposer die as depicted in FIG. 3, in accordance with example embodiments of the disclosure.

FIG. 4 is a photomicrograph of a cross section of an example TSV 326 hole in the interposer die 200 as depicted in FIG. 3, in accordance with example embodiments of the disclosure. These example TSV 326 holes are approximately 200 μm deep and about 60 μm wide. These holes, in example embodiments, may be formed by any suitable plasma etching (e.g., REI, magnetically enhanced reactive ion etching (ME-RIE), high density plasma (HDP) etching, etch-passivation-etch, Bosch etch, inductively coupled plasma (ICP) etching, etc.) using either a photoresist mask or a hard mask (e.g., $SiO_2$, $Si_3N_4$, etc.) and using any suitable process gas (e.g., $SF_6$, $CF_4$, $C_2F_6$, $C_3F_8$, $C_4F_8$, $NF_3$, $O_2$, $CO_2$, etc.). In other example embodiments, the TSV hole may be formed by a laser ablation process.

Continuing with reference to FIG. 4, once the TSV hole is formed in the silicon of the interposer die 200, as depicted, the TSV hole may by passivated, or in other words, a dielectric liner may be provided on the inside walls of the TSV hole. This dielectric liner serves to electrically insulate, or at least partially decouple an electrical signal conducted by the TSV 326 from the surrounding conductive and/or semiconducting substrate of the interposer die 200. The dielectric liner, in example embodiments, may be deposited, such as by a tetra-ethylorthosilicate (TEOS) PECVD deposited $SiO_2$. Alternatively, other materials may be deposited on the inner walls of the TSV hole or a $SiO_2$ film may be formed, such as by thermal oxidation of the silicon substrate of the interposer die 200. Once a dielectric liner is provided on the inside of the TSV hole, the TSV hole may be filled with conductive material, such as electroplated Cu.

Illustrative Processes

Figure 5:
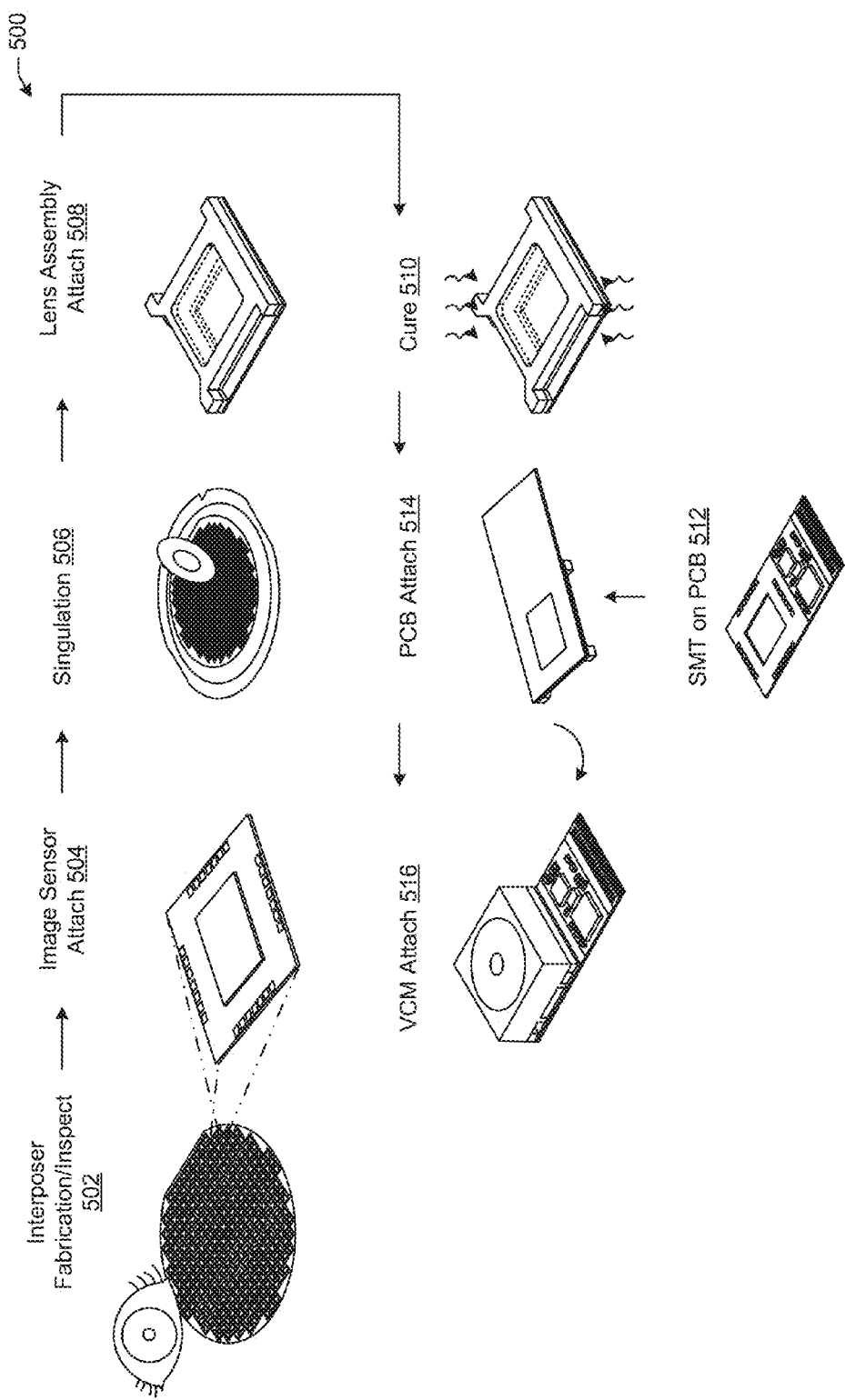
FIG. 5 is a schematic flow diagram of an example method for fabricating an imager module with surface mount devices disposed on a printed circuit board, in accordance with example embodiments of the disclosure.

FIG. 5 is a schematic flow diagram of an example method 500 for fabricating an imager module 100 with surface mount devices (SMDs) 202 disposed on the printed circuit board 120, in accordance with example embodiments of the disclosure. At block 502, the interposer die may be fabricated and inspected. In some example embodiments, the interposer die 200 may be fabricated at a semiconductor fabrication facility (fab) using semiconductor processes and related cleanliness levels. The inspection of the wafer 300 having the interposer die 200 and the subsequent processes of the method 500 may be performed, in example embodiments, outside of a semiconductor fab. For example, in example embodiments, the method 500 may be performed in a back-end assembly and/or packing facility. The fabrication of the interposer die 200 may be performed with the processes described above in conjunction with FIGS. 4 and 5. The interposer die 200 at this point may not yet be singulated, meaning that the interposer die 200 may still be part of the silicon wafer 300 on which it was fabricated with other interposer dies 200.

Upon fabrication, the interposer die 200 may have one or more levels of metal interconnects on either side 310, 320 of the interposer die 200, as well as the bond pads 312, 314, 206 for attaching the image sensor 132, the PCB 120, and the VCM 140, respectively. The interposer die 200 may also have TSVs 326 for routing electrical signals from one side 310, 320 to the other side 320, 310 of the interposer die 200.

The fabricated wafer 300 with the interposer die 200 thereon may be inspected by any suitable mechanism. In example embodiments, automated defectivity scanning tools may be used to inspect the wafer 300. These inspection tools may use electron beam (ebeam) inspection, optical inspection, dark-field inspection, and/or combinations thereof. Alternatively or additionally, in example embodiments, electrical tests (e.g., automated electrical probe) may be performed, such as on the test devices fabricated on the interposer die 200 for the purposes of inspection/test. Further still, in example embodiments, visual inspection may be performed, alternatively or additionally, to identify defective interposer dies 200 on the wafer. When or if defective interposer dies (e.g., known defective or suspected defective) occur, the defective interposer die 200, or conversely known-good-die (KGD), may be identified, such as on a wafer map corresponding to the wafer 300. In some example embodiments, some or all of the subsequent processes of the method 500 may only be performed on KGD, to eliminate the cost of processing on defective interposer dies. In some cases, batch processes at the wafer level may be performed on known defective interposer dies if the costs of reconfiguration of those processes are greater than or within a negligible threshold of the anticipated cost of processing those known defective interposer dies.

At block 504, the image sensor may be attached to the interposer die. This process may be performed at a wafer level (e.g., prior to singulation of the interposer die 200). In example embodiments, the image sensor 132 may be attached to the interposer die 200 by a flip-chip process. In example embodiments, Ni/Au bumps may be fabricated on the bond pads of the image sensor to bond with the first set of bond pads 312 of the interposer die 200. In other example embodiments, Sn/Cu bumps, or any other suitable metallurgy, may be fabricated for the purpose of flip-chip bonding. In some example embodiments, pick-and-place systems may be used for aligning the image sensor 132 onto the interposer die 200, such as by using alignment markers provided on the interposer die 200 and/or the image sensor 132. Thermo-compression bonding may be used in example embodiments to attach the image sensor 132 to the interposer die 200. In some alternative embodiments, thermo-sonic bonding, NCP, or ACP may be used for attaching the image sensor 132 to the interposer die 200. After the image sensor 132 has been attached to the interposer die 200, in some example embodiments, underfill may be provided between the image sensor 132 and the interposer die 200 to protect the joints from oxidation and/or to prevent other failure mechanisms, such as tin whiskering.

At block 506, the wafer 300 may be singulated into individual interposer dies 200. The wafer 300 may be attached to saw tape and may be sawed along predefined saw streets between the individual interposer dies 200. At block 508, the lens assembly may be attached to the interposer chip 110. The lens assembly 130 may be attached to the side of the interposer chip 110 opposite of the side on which the image sensor 132 is attached by the processes of block 504. The lens assembly 130, in example embodiments, may be aligned onto the interposer chip 110, such as by using a pick-and-place system. The pick-and-place tool may use predefined alignment marks or features on the interposer chip 110 and/or the lens assembly 130 to align the lens assembly 130 to the interposer chip 110. The lens assembly 130, in example embodiments, may be attached to the interposer chip 110 by using epoxy. At block 510, a cure process (e.g., thermal and/or ultraviolet (UV) cure) may be used to cure (e.g., crosslink and/or harden) the epoxy used to attach the lens assembly 130 to the interposer chip 110.

At block 512, SMDs may be attached to the PCB. In this example method 500, the SMDs 202 are provided on the PCB 120 rather than the interposer chip 110. The SMDs 202 may be attached using any suitable process, such as surface mount technology (SMT). At block 514, the PCB 120 may be attached to the interposer chip 110. As shown, the PCB 120 may be attached on the same side as the image sensor 132 (e.g., the opposite side of the lens assembly 130). The PCB 120 may have a cutout portion (e.g., a cavity) so that the PCB 120 does not overly the image sensor 132. In example embodiments, the PCB 120 may be attached onto the interposer chip 110 using an ACP process. At block 516, the VCM 140 may be attached onto the interposer chip 110. The VCM 140 may be aligned using a pick-and-place system and may be electrically coupled to the bond pads 206 using any suitable mechanism, such as thermo-compression bonding with Ni/Au bumps/pillars.

Figure 6:
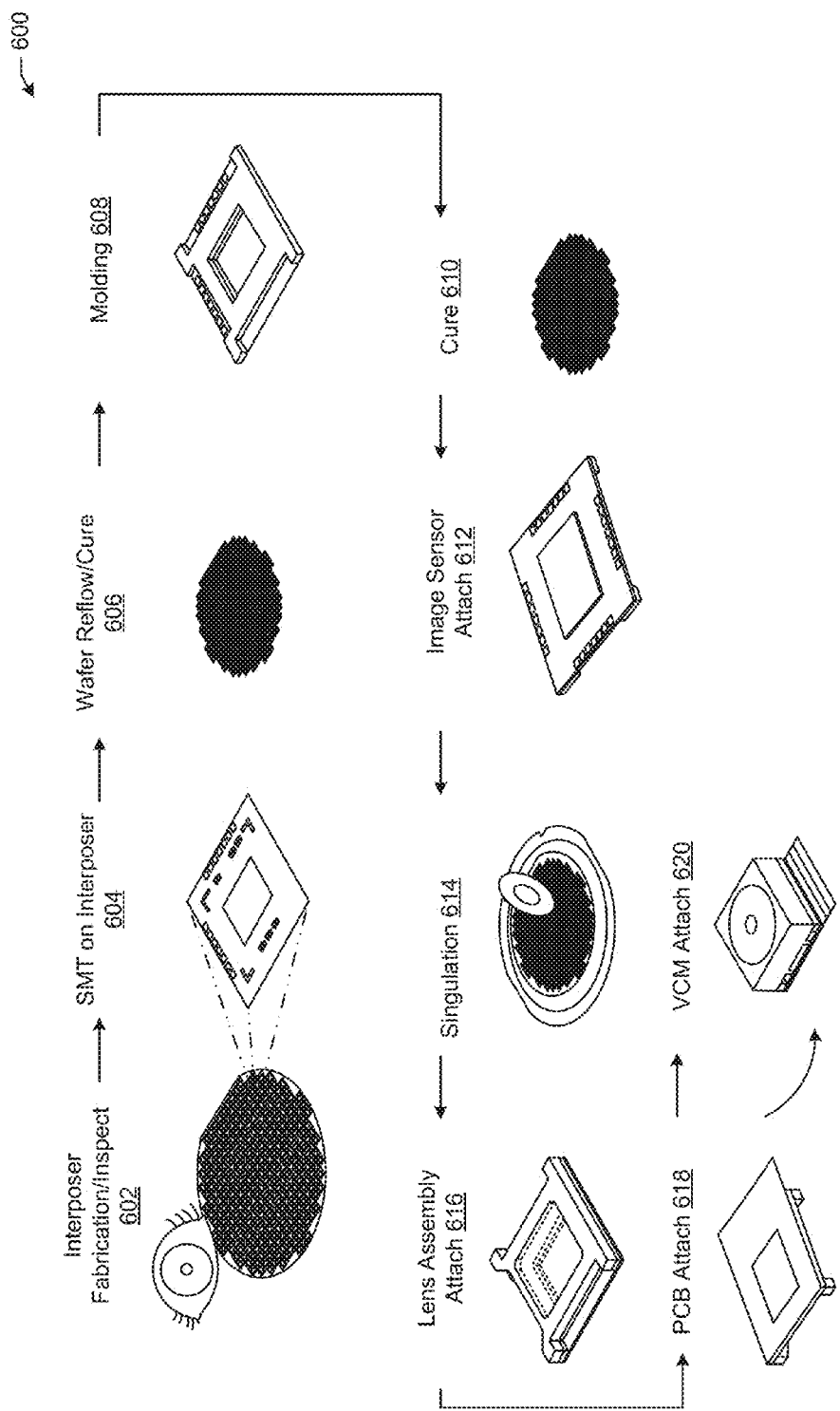
FIG. 6 is a schematic flow diagram of another example method for fabricating an imager module with surface mount devices disposed on the interposer chip, in accordance with example embodiments of the disclosure.

FIG. 6 is a flow diagram of another example method 600 for fabricating an imager module 100 with surface mount devices (SMDs) 202 disposed on the interposer chip 110, in accordance with example embodiments of the disclosure. At block 602, the interposer wafer may be fabricated. In this case, the interposer die 200 may have the fourth set of bond pads 322 formed thereon to enable the SMDs 202 to be attached thereon. The inspection of the wafer 300 may be substantially similar to the processes of block 502 of the method 500 of FIG. 5. At block 604, the SMDs 202 may be attached to the interposer die 200, such as by using SMT processes. The SMDs 202 may be attached to the interposer die 200 using any suitable mechanism, including, for example, solder bump processes on in-line (e.g., dual in-line, quad in-line, etc.) packages, ball grid arrays (BGAs), or the like. Alternatively, Au bump processes may be used.

At block 606, a wafer reflow or cure process may be performed. This reflow may be performed, in example embodiments, in a non-oxidizing environment, such as a reducing environment, such as in a hydrogen ambient. By performing the wafer reflow, reliable, oxide-free, fluxless solder bumps may be achieved for the joints between the SMDs 202 and the interposer die 200.

At block 608, molding material may be deposited on the interposer wafer. This molding 204 may be provided for protecting the SMDs 202. The molding material may be a thermosetting polymer material, in example embodiments. In example embodiments, the molding material may be deposited with a blocking template (e.g., by blocking regions, such as bond pads, where the molding is not desired). At block 610, the molding material may be cured to form the molding. This cure may be a UV cure and/or thermal cure. After the cure the thermoset polymer material may harden (e.g., crosslink) to form the molding 204. The molding 204 may provide a substantially planer surface on top of the SMDs 202 attached on the second side of the interposer chip 110.

At block 612, the image sensor may be attached to the interposer chip. This process may be similar to the processes of block 504 of the method 500 of FIG. 5. Next, at block 614, the interposer chips may be diced or singulated. This process may be similar to the processes of block 506 of the method 500 of FIG. 5. At block 616, the lens assembly may be attached. This process may be similar to the processes of block 508 of the method 500 of FIG. 5. At block 618, the PCB may be attached. This process may be similar to the processes of block 514 of the method 500 of FIG. 5. At block 620, the VCM may be attached. This process may be similar to the processes of block 516 of the method 500 of FIG. 5.

Figure 7:
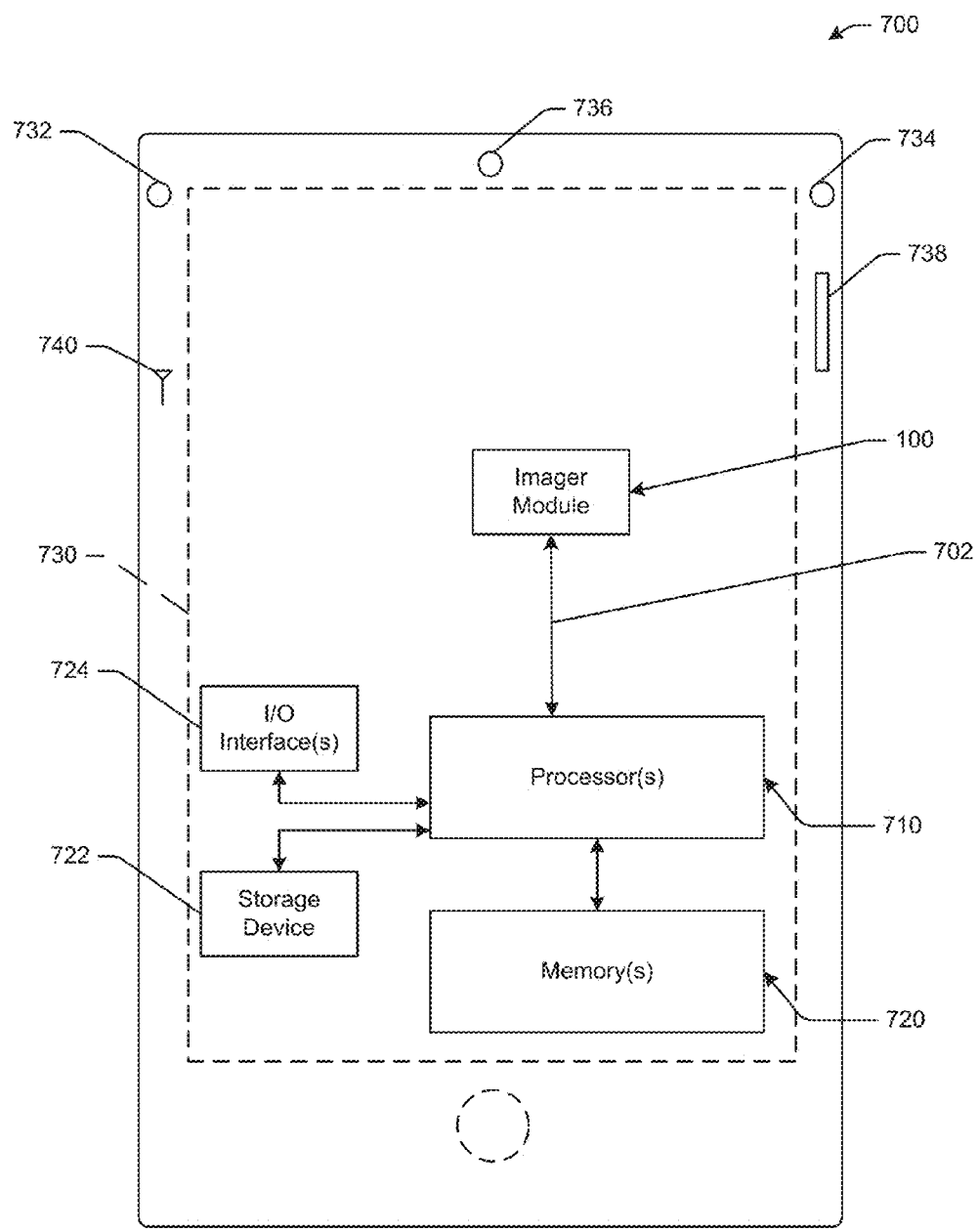
FIG. 7 is a schematic diagram illustrating an example user device with an imager module, in accordance with example embodiments of the disclosure.

FIG. 7 is a schematic diagram illustrating an example user device 700 with an imager module 100, in accordance with example embodiments of the disclosure. In operation, the user device 700 may include computer-readable and computer-executable instructions that reside on the user device 700, as is discussed further below. The user device 700 may include an address/data bus 702 for conveying data among components of the user device 700. Each component within the user device 700 may also be directly connected to other components in addition to (or instead of) being connected to other components across the bus 702.

The imager module 100 may be included within the user device 700, such as a mobile communications device, a personal electronic device, an imaging system, or any device that may have camera functionality. Indeed, the user device 700 may be any one of suitable devices that may be configured to capture images. The user device 700 may include, but is not limited to, a personal computer, a desktop computer, a notebook computer, a laptop computer, a personal digital assistant, an electronic book (ebook) reader, a tablet computing device, a pad computing device, a smartphone, a wearable device, or combinations thereof. The user device 700 may include one or more application processor(s) 710 and/or a memory 720 to control and/or direct the capture of image(s) by the imager module 100 and receive image signal(s) corresponding to the captured image(s) by the imager module 100.

In some example embodiments, the processors 710 of the user device 700 may be implemented as appropriate in hardware, software, firmware, or combinations thereof. Software or firmware implementations of the processors 710 may include computer-executable or machine-executable instructions written in any suitable programming language to perform the various functions described. Hardware implementations of the processors 710 may be configured to execute computer-executable or machine-executable instructions to perform the various functions described. The one or more processors 710 may include, without limitation, a central processing unit (CPU), a digital signal processor (DSP), a reduced instruction set computer (RISC), a complex instruction set computer (CISC), a microprocessor, a microcontroller, a field programmable gate array (FPGA), or any combination thereof. The user device 700 may also include a chipset (not shown) for controlling communication between the one or more processors 710 and one or more of the other components of the user device 700. The one or more processors 710 may also include one or more application specific integrated circuits (ASICs) or application specific standard products (ASSPs) for handling specific data processing functions or tasks.

The memory/storage 720 may include one or more volatile and/or non-volatile memory devices including, but not limited to, random access memory (RAM), dynamic RAM (DRAM), static RAM (SRAM), synchronous dynamic RAM (SDRAM), double data rate (DDR) SDRAM (DDR-SDRAM), RAM-BUS DRAM (RDRAM), flash memory devices, electrically erasable programmable read only memory (EEPROM), non-volatile RAM (NVRAM), universal serial bus (USB) removable memory, non-volatile magnetoresistive (MRAM), or combinations thereof.

The memory 720 may store program instructions that are loadable and executable on the processor(s) 710, as well as data generated or received during the execution of these programs. The memory 720 may include one or more operating systems (O/S) and one or more application software that may be executed by the processors 710 to control the user device 700 and the imager module 100. The memory 720 may also provide temporary "working" storage at runtime for any applications being executed on the processors(s) 710. The computer instructions may be stored in a non-transitory manner in non-volatile memory the 720, the storage device 722, or an external device. Alternatively, some or all of the executable instructions may be embedded in hardware or firmware in addition to or instead of software.

The user device 700 may include input/output (I/O) device interfaces 724. A variety of components may be connected through the input/output device interfaces 724, such as a display or display screen 730 having a touch surface or touchscreen, an audio output device for producing sound, such as speaker(s) 732, one or more audio capture device(s), such as a microphone or an array of microphones 734, one or more image and/or video capture devices, such as the imager module 100, one or more haptic units 738, and other components. The display 730, speaker(s) 732, microphone(s) 734, imager module 100, haptic unit(s) 738, and other components may be integrated into the user device 700 or may be separate.

The display 730 may be a video output device for displaying images. The display 730 may be a display of any suitable technology, such as a liquid crystal display, an organic light emitting diode display, electronic paper, an electrochromic display, a cathode ray tube display, a pico projector, or other suitable component(s). The display 730 may also be implemented as a touchscreen and may include components such as electrodes and/or antennae for use in detecting stylus input events or detecting when a stylus is hovering above, but not touching, the display 730.

The input/output device interfaces 724 may also include an interface for an external peripheral device connection such as universal serial bus (USB), FireWire, Thunderbolt, Ethernet port or other connection protocol that may connect to one or more networks. The input/output device interfaces 724 may also include a connection to antenna 740 to connect one or more networks via a wireless local area network (WLAN) (such as WiFi) radio, Bluetooth, and/or a wireless network radio, such as a radio capable of communication with a wireless communication network such as a Long Term Evolution (LTE) network, a WiMAX network, a 3G network, etc.

The processor(s) 710, by executing instructions stored in the memory 720 and/or the storage device 722 may be configured to control the operations of the imager module 100, as described above. In particular, the processor(s) 710 may be configured to provide the imager module 100 with one or more control signals via the PCB 120 and the interposer chip 110 to the VCM 140. The processor(s) 710 may further be configured to cause the image sensor 132 of the imager module 100 to capture an image and further receive, process, display, such as on the display screen 730, and/or store, such as in the memory 720 or the storage device 722, the image data.

Various other changes and modifications to the embodiments herein chosen for purposes of illustration will readily occur to those skilled in the art. For example, certain materials for the purposes of bonding and/or TSV formation were described, but other materials may also be effective. Further additional intervening layers may be able to be provided while still benefiting from the explained embodiments. Examples were described to aid in understanding. Thus, it was not intended that these examples were the only examples. To the extent that such modifications and variations do not depart from the spirit of the invention, they are intended to be included within the scope thereof. It will be readily understood to those skilled in the art that various other changes in the details, material, and arrangements of the parts and method stages which have been described and illustrated in order to explain the nature of this disclosure may be made without departing from the principles and scope of the disclosure.

Although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments could include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

What is claimed is:

1. A mobile device, comprising:
    an interposer chip with a first side and an opposing second side and having an opening extending from the first side to the second side, wherein the interposer chip further includes a first set of bond pads on the first side, a second set of bond pads on the first side, a third set of bond pads on the second side, and a plurality of through-silicon vias (TSVs) for conducting electrical signals between the second set of bond pads and the third set of bond pads;
    an image sensor electrically coupled to the first set of bond pads and disposed such that one or more photosensitive pixels of the image sensor are configured to receive light through the opening;
    a lens assembly including one or more lenses disposed on the second side of the interposer chip and configured to pass light reflecting from an object through the opening and onto the one or more photosensitive pixels of the image sensor;
    a voice coil motor (VCM) mechanically coupled to the lens assembly and electrically coupled to the third set of bond pads, wherein the VCM is configured to move the lens assembly; and
    a printed circuit board (PCB) electrically coupled to the second set of bond pads of the interposer chip, wherein the second set of bond pads is configured to:
        provide one or more image sensor control signals from the PCB to the image sensor; and
        provide one or more VCM control signals to the VCM via the plurality of TSVs, and
    wherein the interposer chip is configured to provide one or more image signals from the image sensor to the PCB.

2. The mobile device of claim 1, wherein the interposer chip includes a fourth set of bond pads on the second side, the fourth set of bonds pads electrically coupling one or more surface mount devices (SMDs) to the interposer chip.

3. The mobile device of claim 1, wherein the interposer chip includes a first interconnect layer on the first side to receive VCM control signals from the PCB and a second interconnect layer on the second side electrically connected to the VCM, wherein the TSVs are configured to route the one or more VCM control signals from the first interconnect layer to the second interconnect layer to route the one or more VCM control signals from the PCB to the VCM.

4. The mobile device of claim 1, wherein a first area of each of the first set of bond pads is less than a second area of each of the second set of bond pads.

5. An imager module, comprising:
an interposer chip with a first side and an opposing second side and having an opening extending from the first side to the second side, wherein the interposer chip further includes a first set of bond pads on the first side and a second set of bond pads on the first side;
an image sensor electrically coupled to the interposer chip on the first side and overlying the opening such that one or more photosensitive pixels of the image sensor are configured to receive light through the opening, wherein the image sensor is electrically coupled to the interposer chip using the first set of bond pads;
a lens assembly including one or more lenses disposed on the second side and configured to pass light reflecting from an object through the cavity and onto the one or more photosensitive pixels;
an electromechanical device mechanically coupled to the lens assembly and electrically coupled to the second side; and
a printed circuit board (PCB) electrically coupled to the interposer chip and configured to route electrical signals to the electromechanical device via the interposer chip, wherein the PCB is electrically coupled to the interposer chip using the second set of bond pads.

6. The imager module of claim 5, wherein the PCB is electrically coupled to the interposer chip by anisotropic conductive paste (ACP).

7. The imager module of claim 5, wherein the first set of bond pads has a width less than a width of the second set of bond pads.

8. The imager module of claim 5, wherein the interposer chip further includes vias to route a portion of the electrical signals from the PCB to the electromechanical device.

9. The imager module of claim 5, wherein the interposer chip includes a set of bond pads on the second side, the set of bonds pads electrically coupling one or more surface mount devices (SMDs) to the interposer chip.

10. A device comprising:
an interposer chip with a first side and an opposing second side and having an opening extending from the first side to the second side, wherein the interposer chip comprises a first set of bond pads on the first side of the interposer chip and a second set of bond pads on the first side of the interposer chip;
an image sensor disposed on the first side of the interposer chip and configured to receive light through the opening, wherein the image sensor is electrically coupled to the interposer chip using the first set of bond pads;
a lens assembly disposed on the second side of the interposer chip and configured to pass the light into the opening for receipt by the image sensor;
a lens movement device configured to move the lens assembly to focus the light on the image sensor; and
a printed circuit board (PCB) electrically coupled to the interposer chip and configured to route electrical signals to the lens movement device via the interposer chip, wherein the PCB is electrically coupled to the interposer chip using the second set of bond pads.

11. The device of claim 10, wherein the interposer chip further includes vias to route a portion of the electrical signals from the PCB to the lens movement device.

12. The device of claim 10, wherein the interposer chip comprises a first interconnect layer on the first side of the interposer chip to receive control signals from the PCB and a second interconnect layer on the second side electrically connected to the lens movement device, and through-silicon vias (TSVs) configured to route the control signals from the first interconnect layer to the second interconnect layer to route the one or more control signals from the PCB to the lens movement device.

13. The device of claim 10, wherein the interposer chip includes a set of bond pads on the second side of the interposer chip, the set of bonds pads electrically coupling one or more surface mount devices (SMDs) to the interposer chip.

14. The device of claim 10, wherein the image sensor is electrically coupled to the first side of the interposer chip and overlays the opening such that a photosensitive element of the image sensor is configured to receive light through the opening.

15. The device of claim 10, wherein the lens assembly comprises one or more lenses disposed on the second side and configured to pass light reflecting from an object through the opening and onto the one or more photosensitive pixels.

16. The device of claim 10, wherein the lens movement device comprises an electromechanical device.

* * * * *